United States Patent
Li et al.

(10) Patent No.: US 11,018,275 B2
(45) Date of Patent: May 25, 2021

(54) METHOD OF CREATING CIGS PHOTODIODE FOR IMAGE SENSOR APPLICATIONS

(71) Applicant: Applied Materials, Inc., Santa Clara, CA (US)

(72) Inventors: Philip Hsin-hua Li, San Jose, CA (US); Seshadri Ramaswami, Saratoga, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/653,750

(22) Filed: Oct. 15, 2019

(65) Prior Publication Data

US 2021/0111297 A1    Apr. 15, 2021

(51) Int. Cl.
*H01L 31/109* (2006.01)
*H01L 31/032* (2006.01)
*H01L 31/18* (2006.01)

(52) U.S. Cl.
CPC .......... *H01L 31/109* (2013.01); *H01L 31/032* (2013.01); *H01L 31/0322* (2013.01); *H01L 31/18* (2013.01)

(58) Field of Classification Search
None
See application file for complete search history.

(56) References Cited

U.S. PATENT DOCUMENTS

2011/0008927 A1    1/2011    Huang et al.
2013/0291936 A1    11/2013   Chen et al.

OTHER PUBLICATIONS

Kikuchi, K, et al. "Properties of Ga2O3/Ga2O3:Sn/CIGS for Visible Light Sensors." Journal of Physics: Conference Series, vol. 619, 2015, p. 012009., doi:10.1088/1742-6596/619/1/012009. (Year: 2015).*
Kikuchi, Kenji, et al. "Electrical and Optical Properties of Ga2O3/CuGaSe2 Heterojunction Photoconductors." Thin Solid Films, vol. 550, 2014, pp. 635-637., doi:10.1016/j.tsf.2013.10.036. (Year: 2014).*
Isukapati, S.B., "Gallium Oxide Thin Films for Optoelectronic Applications", Youngstown State University, May 2018, diss. Electrical Engineering. (Year: 2018).*

(Continued)

*Primary Examiner* — J. E. Schoenholtz
(74) *Attorney, Agent, or Firm* — Schwabe, Williamson & Wyatt, P.C.

(57) ABSTRACT

Embodiments disclosed herein include photodiodes and methods of forming such photodiodes. In an embodiment, a method of creating a photodiode, comprises disposing an absorber layer over a first contact, wherein the absorber layer comprises a first conductivity type, and disposing a semiconductor layer over the absorber, wherein the semiconductor layer has a second conductivity type that is opposite from the first conductivity type. In an embodiment, the method further comprises disposing a hole blocking layer over the semiconductor layer, wherein the hole blocking layer is formed with a reactive sputtering process with a processing gas that comprises oxygen, and disposing a second contact over the hole blocking layer.

20 Claims, 5 Drawing Sheets

(56) References Cited

OTHER PUBLICATIONS

Li, Hui, et al. "Engineering CIGS Grains Qualities to Achieve High Efficiency in Ultrathin Cu(In Ga1-)Se2 Solar Cells with a Single-Gradient Band Gap Profile." Results in Physics, vol. 12, 2019, pp. 704-711., doi:10.1016/j.rinp.2018.12.043. (Year: 2019).*

Garud, S., Gampa, N., Allen, T.G., Kotipalli, R., Flandre, D., Batuk, M., Hadermann, J., Meuris, M., Poortmans, J., Smets, A. and Vermang, B. (2018), Surface Passivation of CIGS Solar Cells Using Gallium Oxide. Phys. Status Solidi A, 215: 1700826. doi:10.1002/pssa.201700826. (Year: 2018).*

Dong, Linpeng, et al. "Effects of Oxygen Vacancies on the Structural and Optical Properties of ß-Ga2O3." Scientific Reports, vol. 7, No. 1, 2017, doi:10.1038/srep40160. (Year: 2017).*

Cha, Su Yeon, et al. "Characterization of Non-Stoichiometric Ga2O3-x Thin Films Grown by Radio-Frequency Powder Sputtering." Ceramics International, vol. 47, No. 3, 2021, pp. 3238-3243., doi:10.1016/j.ceramint.2020.09.162. (Year: 2020).*

Siah, et al., "Dopant activation in Sn-doped $Ga_2O_3$ investigated by X-ray absorption spectroscopy," Applied Physics Letter 107, 252103, 23 (2015), 6 pgs.

Kikuchi, et al. "Electrical and optical properties of $Ga_2O_3$/$CuGaSe_2$ heterojunction photoconductors," Thin Solid Films 550 (2014) 635-637 (2013), 3 pgs.

Fleischer, et al., "Electron mobility in single- and polycrystalline $Ga_2O_3$," Journal of Applied Physics 74, 300 (1993), 7 pgs.

Suzuki, et al., "Fabrication and characterization of transparent conductive Sn-doped ß-$Ga_2O_3$ single crystal," phys. Stat. sol. (c) 4, No. 7 (2007), 4 pgs.

Kikuchi, et al., "Photocurrent multiplication in $Ga_2O_3$/$CuInGaSe_2$ heterojunction photosensors," Sensors and Actuators A 224 (2015) 24-29, 6 pgs.

Kikuchi, et al., "Properties of $Ga_2O_3$; Sn/CIGS for visible light sensors," Journal of Physics: Conference Series 619 (2015) 012009, 5 pgs.

Kokubun, et al., "Sol-gel prepared ß-$Ga_2O_3$ thin films for ultraviolet photodectors," Applied Physics Letter 90, 031912 (2007), 4 pgs.

Garten, et al., "Structure Property Relationships in $Ga_2O_3$ Thin Films Grown by Pulsed Laser Deposition," vol. 6, Issue 4, Dec. 2016, pp. 348-353, 14 pgs.

Bayraktaroglu, Assessment of $Ga_2O_3$ Technology, Defense Technical Information Center, AFRL/RYDD WPAFB United States, Sep. 15, 2016, 97 pgs.

International Search Report and Written Opinion from U.S. Patent Application No. PCT/US2020/053845 dated Jan. 26, 2021, 10 pgs.

Ji Hye Kim, et al. Increase in conversion efficiency of above 14% in Ci(In, Ga)3Se5 (β-CIGS) solar cells by Na2S incorporation through the surface of β-CIGS film. Solar Energy Martials and Solar Cells, Jun. 1, 2018, vol. 179, pp. 289-296 Retrieved from <doi.org/10.1016/j.tsf.2013.10.036> pp. 289-296.

* cited by examiner

METHOD OF CREATING CIGS PHOTODIODE FOR IMAGE SENSOR APPLICATIONS

BACKGROUND

1) Field

Embodiments relate to the field of semiconductor manufacturing and, in particular, to systems and methods for improved photodiode efficiency.

2) Description of Related Art $CuIn_{1-x}Ga_xSe_2$ (CIGS) thin films have been used as one layer in a diode for photodiode applications. The other layer of the diode may include a $Ga_2O_3$ layer. The use of $Ga_2O_3$ has provided improvements in performance (over the use of CdS layers) in part because of the wider bandgap of $Ga_2O_3$ (i.e., 4.9 eV) and high transmittance of visible light. $Ga_2O_3$ is also more environmentally friendly than CdS due to the presence of cadmium.

However, CIGS based photodiodes with $Ga_2O_3$ have not been optimized for characteristics such as quantum efficiency and reduction of leakage current (also referred to as dark current). Particularly, CIGS photodiodes are particularly susceptible to high dark current levels. Accordingly, the signal to noise (e.g., signal to dark current) ratio of CIGS photodiodes is not currently adequate for most uses.

SUMMARY

Embodiments disclosed herein include photodiodes and methods of forming such photodiodes. In an embodiment, a method of creating a photodiode, comprises disposing an absorber layer over a first contact, wherein the absorber layer comprises a first conductivity type, and disposing a semiconductor layer over the absorber, wherein the semiconductor layer has a second conductivity type that is opposite from the first conductivity type. In an embodiment, the method further comprises disposing a hole blocking layer over the semiconductor layer, wherein the hole blocking layer is formed with a reactive sputtering process with a processing gas that comprises oxygen, and disposing a second contact over the hole blocking layer.

Embodiments may also include a photodiode that comprises an absorber layer, wherein the absorber layer has a first conductivity type, and a semiconductor layer over the absorber layer, wherein the semiconductor layer has a second conductivity type. In an embodiment, the photodiode further comprises a hole blocking layer over the semiconductor layer, wherein the hole blocking layer comprises an excess concentration of oxygen.

Embodiments may also include a photodiode that comprises a first contact, a P-type absorber over the first contact, wherein the absorber comprises a $CuIn_{1-x}Ga_xSe_2$ (CIGS) film, and an N-type semiconductor layer over the absorber, wherein the semiconductor layer comprises $Ga_2O_3$ and Sn. In an embodiment, the photodiode further comprises a hole blocker over the semiconductor layer, wherein the hole blocker comprises $Ga_2O_3$ with an excess atomic percentage of oxygen, and a second contact over the hole blocker.

DETAILED DESCRIPTION

Systems and methods described herein include processes for modulating the resistance of various layers in a photodiode by increasing and/or decreasing the oxygen content of various layers. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, photodiodes with diodes comprising a CIGS film and a $Ga_2O_3$ film have demonstrated improvements over photodiodes where the $Ga_2O_3$ is replaced with CdS. However, such photodiodes still suffer from non-optimal quantum efficiencies and high dark currents. Accordingly, embodiments disclosed herein include photodiode constructions that provide improved quantum efficiencies and/or reduced dark currents. Particularly, embodiments disclosed herein include processes that allow for modulation of the resistance and/or dopant concentration of various layers in the photodiode. Generally, increases in the resistance will decrease the dark current, and increasing the dopant concentration will increase quantum efficiency by driving the depletion region deeper into the CIGS film.

Figure 1:
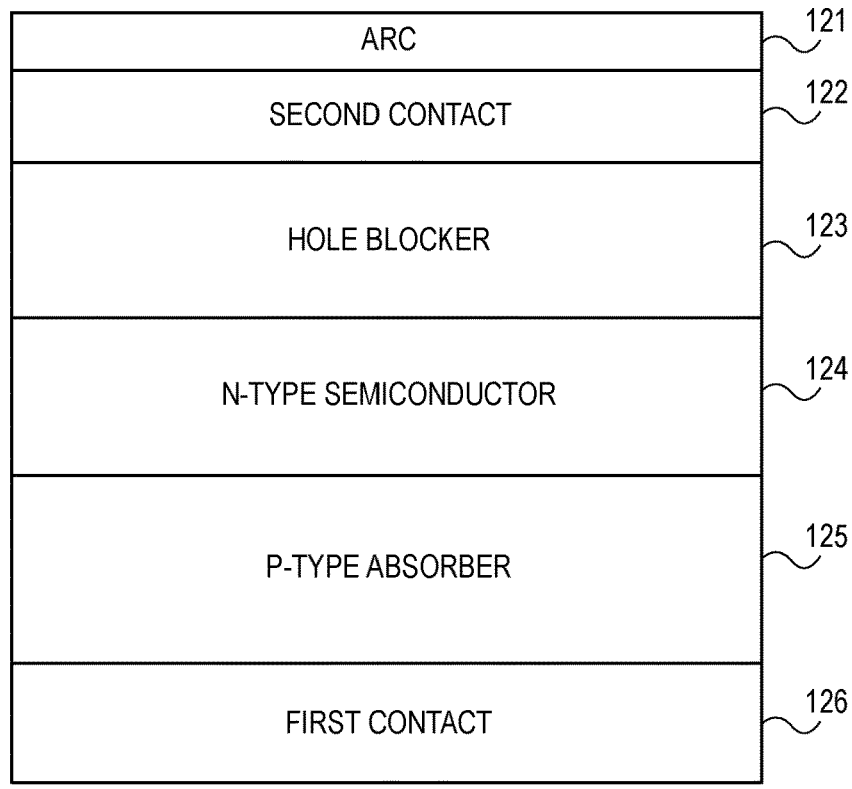
FIG. 1 is a cross-sectional illustrations of a photodiode with a $CuIn_{1-x}Ga_xSe_2$ (CIGS) film, in accordance with an embodiment.

Referring now to FIG. 1, a cross-sectional illustration of a photodiode 100 is shown, in accordance with an embodiment. In an embodiment, the photodiode 100 may comprise a first contact 126. The first contact 126 may be one or more suitable conductive materials. For example, the first contact 126 may comprise molybdenum (Mo) or the like. In an embodiment, the first contact 126 may have a thickness that is between approximately 100 nm and approximately 1 μm. The first contact layer 126 may be disposed over a substrate (not shown). For example, the substrate may comprise a glass substrate, a semiconductor substrate, or any other suitable material on which a photodiode 100 may be fabricated.

In an embodiment, an absorber layer 125 is disposed over the first contact 126. The absorber layer 125 may be a semiconductor material with a first conductivity type. For example, the first conductivity type may be P-type. In a particular embodiment, the absorber layer 125 is a $CuIn_{1-x}Ga_xSe_2$ (CIGS) film. The variable X may be chosen to provide desired electrical properties and may be between 0 and 1. The absorber layer 125 may have any suitable thickness. For example, the absorber layer 125 may have a thickness that is between approximately 0.5 μm and 5 μm.

In an embodiment, a semiconductor layer 124 is disposed over the absorber layer 125. The semiconductor layer 124 may have a second conductivity type that is opposite from the first conductivity type. For example, where the absorber layer 125 is P-type, the semiconductor layer 124 is N-type. Accordingly, a P—N diode is formed between the semiconductor layer 124 and the absorber layer 125.

In an embodiment, the semiconductor layer 124 comprises $Ga_2O_3$. In some embodiments, the semiconductor layer 124 may further comprise a dopant to increase conductivity of the semiconductor layer. For example, a $Ga_2O_3$ semiconductor layer 124 may be doped with tin (Sn). In an embodiment, the atomic percentage of Sn may be between approximately 5% and approximately 10%. Increasing the conductivity of the semiconductor layer 124 drives the depletion region deeper into the absorber layer and improves quantum efficiency. As will be described in greater detail below, the resistance of the semiconductor layer 124 may also be decreased by integrating excess oxygen into the semiconductor layer 124. For example, excess oxygen may be supplied by a reactive sputtering process that utilizes a processing gas comprising oxygen. In an embodiment, the semiconductor layer 124 may have a thickness between approximately 10 nm and approximately 100 nm.

In an embodiment, the photodiode 100 may further comprise a hole blocker 123 disposed over the semiconductor layer 124. In an embodiment, the hole blocker 123 comprises a material with a high potential barrier in order to suppress the injection of holes from the second contact 122 to the P—N diode. The blocking of hole injection reduces the dark current.

In a particular embodiment, the hole blocker 123 may also comprise $Ga_2O_3$. However, whereas the doping concentration of the semiconductor layer 124 is increased to improve quantum efficiency, the hole blocker 123 is primarily used to mitigate dark current. Accordingly, in addition to blocking the injection of holes, the resistance of the hole blocker 123 is also increased relative to the resistance of the semiconductor layer 124. For example, the resistance of the hole blocker 123 may be increased by increasing the atomic percentage of oxygen in the $Ga_2O_3$. The oxygen concentration may be increased by using a reactive sputtering process with a processing gas that comprises oxygen. The use of an oxygen partial pressure during the sputtering reduces the number of oxygen vacancies and, therefore, increases the resistance. In an embodiment, the atomic percentage of oxygen may be increased by up to approximately 5% above the concentration of oxygen typical of the hole blocker material (e.g., $Ga_2O_3$) In some embodiments, the oxygen partial pressure may be increased or decreased during the sputtering to provide a graded (e.g., non-uniform) oxygen concentration through the thickness of the hole blocker 123. In an embodiment, the hole blocker 123 may have a thickness between 25 nm and 200 nm.

In an embodiment, the photodiode 100 may further comprise a second contact 122 disposed over the hole blocker 123. The second contact 122 may be any suitable conductive material that is substantially optically transparent to a desired bandwidth of electromagnetic radiation. For example, the second contact 122 may comprise indium tin oxide (ITO) or the like. In an embodiment, the second contact 122 may have a thickness that is between approximately 50 nm and 500 nm.

In an embodiment, the photodiode 100 may further comprise an antireflective coating (ARC) 121 over the second contact 122. The ARC 121 may improve efficiency of the device by reducing reflected electromagnetic radiation. In an embodiment, the ARC 121 may comprise $SiO_2$ or the like. The thickness of the ARC 121 may be any thickness suitable for a reducing or substantially eliminating reflections. For example, the thickness of the ARC 121 may be between approximately 10 nm and approximately 50 nm.

In the description of FIG. 1 above, the photodiode 100 is particularly described as a CIGS photodiode with a $Ga_2O_3$ semiconductor layer and hole blocker. However, it is to be appreciated that embodiments disclosed herein are applicable to many different photodiode constructions. Particularly, embodiments disclosed herein include modifications to the semiconductor layer 124 and the hole blocker 123 that improve quantum efficiency and reduce dark current. Generally, quantum efficiency is improved by increasing the doping concentration of the semiconductor layer 124 to drive the depletion region deeper into the absorber layer 125, and the dark current is reduced by increasing the resistance of the hole blocker 123 by adding excess oxygen. Such modifications may be similarly applicable to other material systems.

Figure 2:
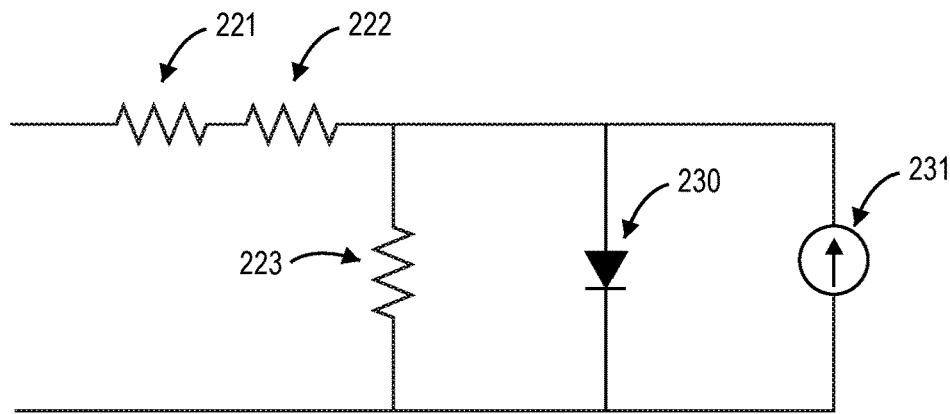
FIG. 2 is a circuit diagram of an equivalent circuit of a photodiode with a CIGS film, in accordance with an embodiment.

Referring now to FIG. 2, an equivalent circuit diagram 200 of a photodiode is shown, in accordance with an embodiment. The equivalent circuit diagram 200 is useful in illustrating the benefits of an increased resistance of various layers with respect to the reduction in dark current.

In an embodiment, the equivalent circuit comprises a first resistor 221 that represents the contact resistance and a second resistor 222 that represents the resistance of the hole blocker 123. The third resistor 223 is the shunt resistance (also referred to as the "on resistance"). The equivalent circuit 200 further comprises a diode 230 and a current source 231 that are in parallel with the third resistor 223.

The total resistance $R_{Total}$ of the equivalent circuit diagram 200 is represented by Equation 1. As shown, the total resistance $R_{Total}$ is equal to the sum of the contact resistance $R_{Contact}$, the hole blocker resistance $R_{Hole\ Blocker}$, and the shunt resistance $R_{Shunt}$. The dark current is dictated in part by the total resistance $R_{Total}$. That is, increasing the total resistance $R_{Total}$ will result in a decrease in the dark current. In a particular embodiment, the total resistance $R_{Total}$ is increased by increasing the hole blocker resistance $R_{Hole\ Blocker}$. As noted above, the hole blocker resistance $R_{Hole\ Blocker}$ is increased by increasing the atomic percentage of oxygen in the hole blocker 123.

$$R_{Total} = R_{Contact} + R_{Hole\ Blocker} + R_{Shunt} \quad \text{Equation 1}$$

However, it is to be appreciated that increasing the total resistance $R_{Total}$ may also negatively affect the signal intensity. Accordingly, there is a tradeoff between the signal intensity and dark current. Embodiments disclosed herein, therefore, include a process for identifying an optimum balance between the two parameters.

Figure 3:
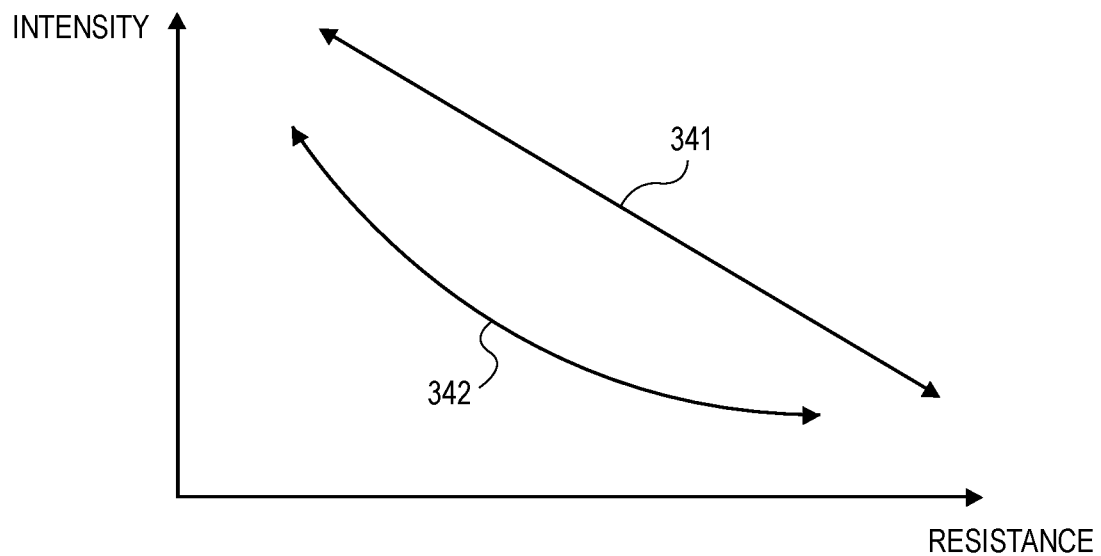
FIG. 3 is a graph of resistance versus intensity of the signal and the dark current of a photodiode with a CIGS film, in accordance with an embodiment.

An exemplary graph of the resistance versus intensity with the signal 341 and the dark current 342 is shown in FIG. 3. The plots shown in FIG. 3 utilize a fictional set of data points and may or may not reflect the exact relationship between the two parameters. However, the graph in FIG. 3 does illustrate that slopes and shapes of the two parameters may not be directly correlated with each other. That is, the ratio of signal intensity to dark current intensity may not be uniform for all resistance values. Accordingly, an optimum resistance value may be selected that provides the highest signal to dark current ratio. Once the desired resistance value is determined, the oxygen content of the hole blocker 123 needed to achieve that resistance can be determined in order to provide an optimized photodiode 100.

Embodiments disclosed herein also comprise methods of fabricating such optimized photodiodes with processing operations that are easily tailored to provide the desired resistances and dopant concentrations. An example of one such processing method is described with respect to the process flow diagram in FIG. 4 and the corresponding cross-sectional illustrations of each processing operation in FIGS. 5A-5D.

Figure 4:
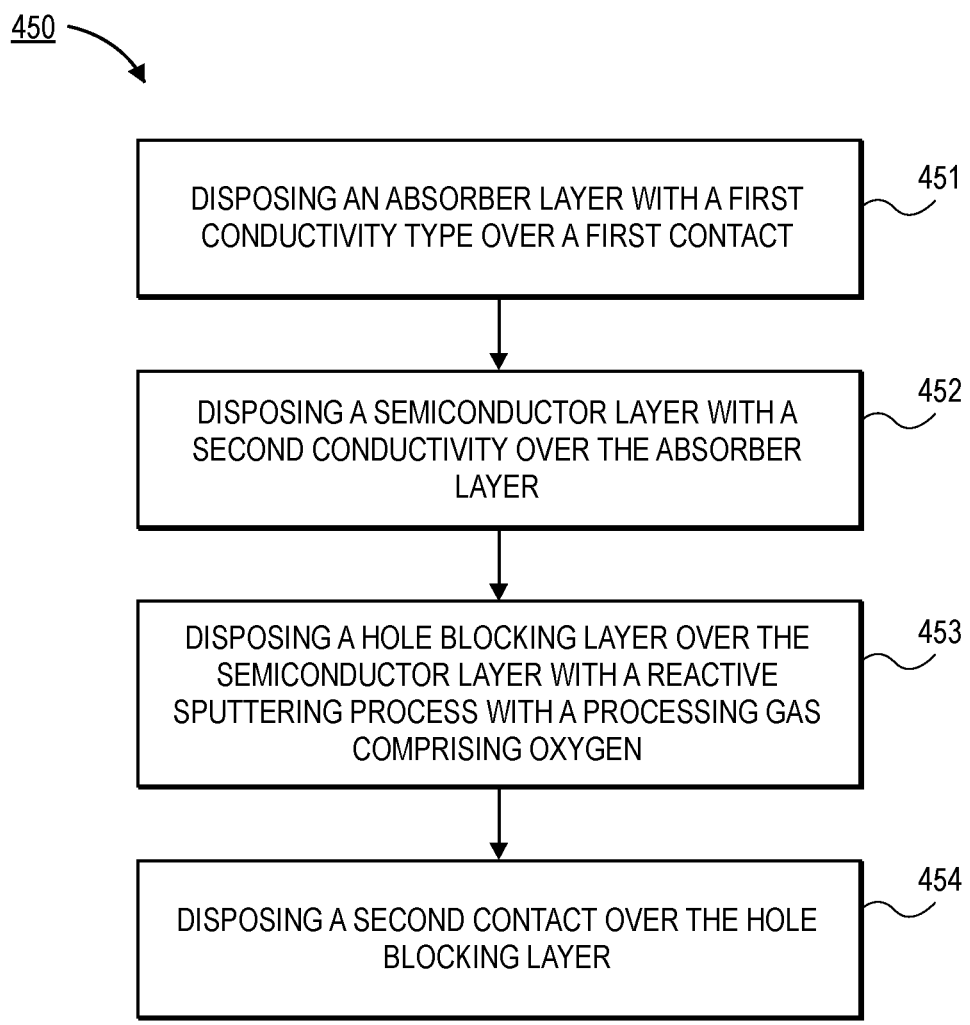
FIG. 4 is a process flow diagram of a process for fabricating a photodiode with a CIGS film, in accordance with an embodiment.

Referring now to FIG. 4, a process flow diagram of a process 450 is shown, in accordance with an embodiment. In an embodiment, the process 450 may begin with operation 451 which comprises disposing an absorber layer 525 with a first conductivity type over a first contact. In an embodiment, the first conductivity type may be a P-type semiconductor. In a particular embodiment, the absorber layer is a CIGS film. The absorber layer may be deposited with any suitable deposition process. As shown in the partially formed photodiode 500 in FIG. 5A, the absorber layer 525 may be disposed over a first contact 526. The first contact 526 may be disposed over a substrate 519 (e.g., glass, silicon, etc.).

Figure 5A:
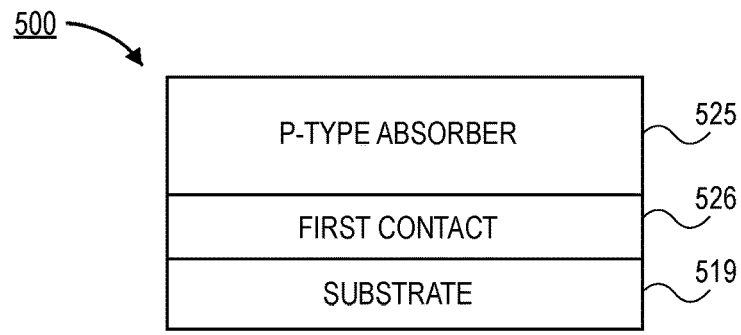
FIG. 5A is a cross-sectional illustration of an absorber layer disposed over a first contact, in accordance with an embodiment.
Figure 5B:
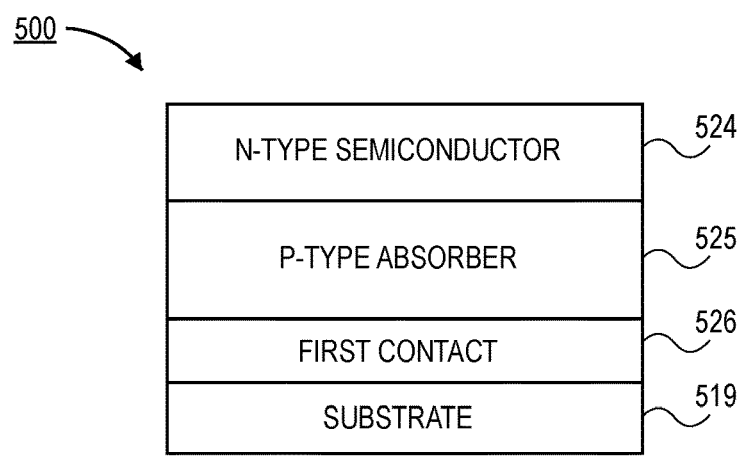
FIG. 5B is a cross-sectional illustration of a semiconductor layer disposed over the absorber layer, in accordance with an embodiment.

In an embodiment, process 450 may continue with operation 452 which comprises disposing a semiconductor layer 524 with a second conductivity type over the absorber layer 525, as shown in FIG. 5B. In an embodiment where the first conductivity type is a P-type semiconductor, the second conductivity type is an N-type semiconductor. For example, the semiconductor layer 524 may comprise $Ga_2O_3$. In some embodiments, the $Ga_2O_3$ may be doped with Sn. Doping with Sn may allow for an increase in the N-type doping (e.g., to provide $N^+$ or $N^{++}$ doping) of the semiconductor layer 524. For example, an atomic percentage of Sn in the semiconductor layer 524 may be between approximately 5% and approximately 10%. Increasing the doping drives the depletion region of the diode (formed by the absorber layer 525 and the semiconductor layer 524) further into the absorber layer 525. Driving the depletion region further into the absorber layer 525 increases the quantum efficiency of the photodiode 500.

In some embodiments, the semiconductor layer 524 may be disposed over the absorber layer 525 with any suitable process. For example, a PVD process, such as sputtering may be used to deposit the semiconductor layer 524. In some embodiments, excess oxygen may also be incorporated into the semiconductor layer 524 in order to selectively increase the resistance of the semiconductor layer 524. Additional oxygen may be incorporated into the semiconductor layer 524 with processes such as reactive sputtering with the use of an oxygen containing process gas.

Figure 5C:
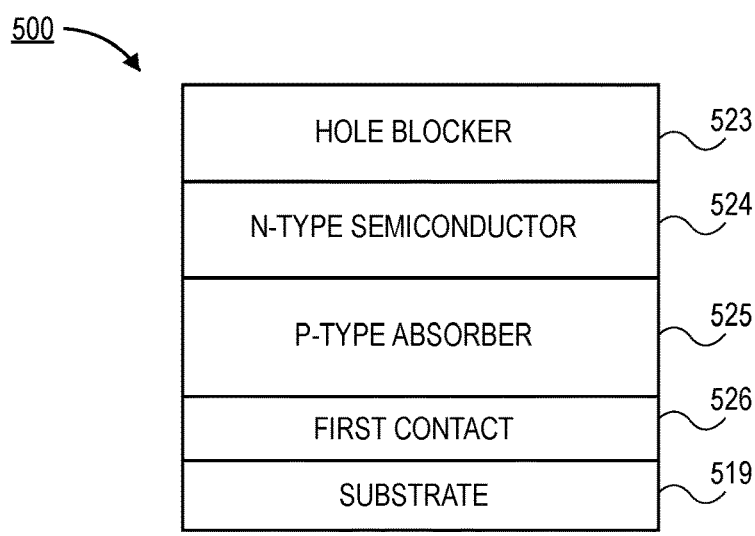
FIG. 5C is a cross-sectional illustration of a hole blocker layer disposed over the semiconductor layer, in accordance with an embodiment.

In an embodiment, process 450 may continue with operation 453 which comprises disposing a hole blocking layer 523 over the semiconductor layer 524 with a reactive sputtering process with a processing gas comprising oxygen, as shown in FIG. 5C. In some embodiments, the hole blocking layer 523 may comprise $Ga_2O_3$ with an excess of oxygen. That is, the atomic percentage of oxygen in the hole blocking layer 523 may be up to approximately 5% higher than in a typical $Ga_2O_3$ layer. Accordingly, the resistance of the hole blocking layer 523 may be increased in order to reduce the dark current in the system. Those skilled in the art will recognize that the use of reactive sputtering to provide the excess oxygen is particularly useful as the oxygen concentration of the hole blocking layer 523 may be easily controlled by changing the partial pressure of oxygen in the reactive sputtering chamber. That is, different sputtering targets are not needed in order to modulate the oxygen content of the hole blocking layer 523 as is necessary in processes, such as pulsed laser deposition (PLD). Furthermore, reactive sputtering also allows for the oxygen concentration to be graded within the thickness of the hole blocking layer 523 by increasing or decreasing the oxygen partial pressure during the deposition of the hole blocking layer 523.

Figure 5D:
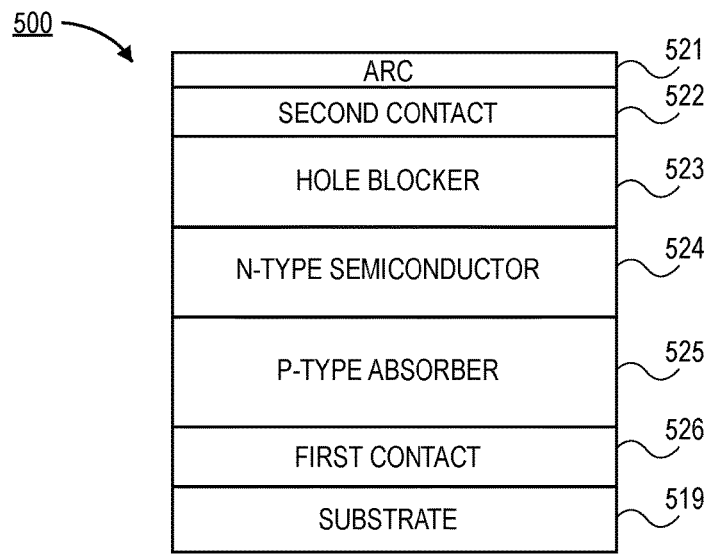
FIG. 5D is a cross-sectional illustration of a second contact disposed over the hole blocker layer, in accordance with an embodiment.

In an embodiment, process 450 may continue with operation 454 which comprises disposing a second contact 522 over the hole blocking layer 523, as shown in FIG. 5D. In an embodiment, the second contact 522 may be any conductive layer that is substantially transparent to a desired bandwidth of electromagnetic radiation. For example, the second contact 522 may comprise ITO or the like. In some embodiments, an ARC 521 may also be disposed over the second contact 522.

Figure 6:
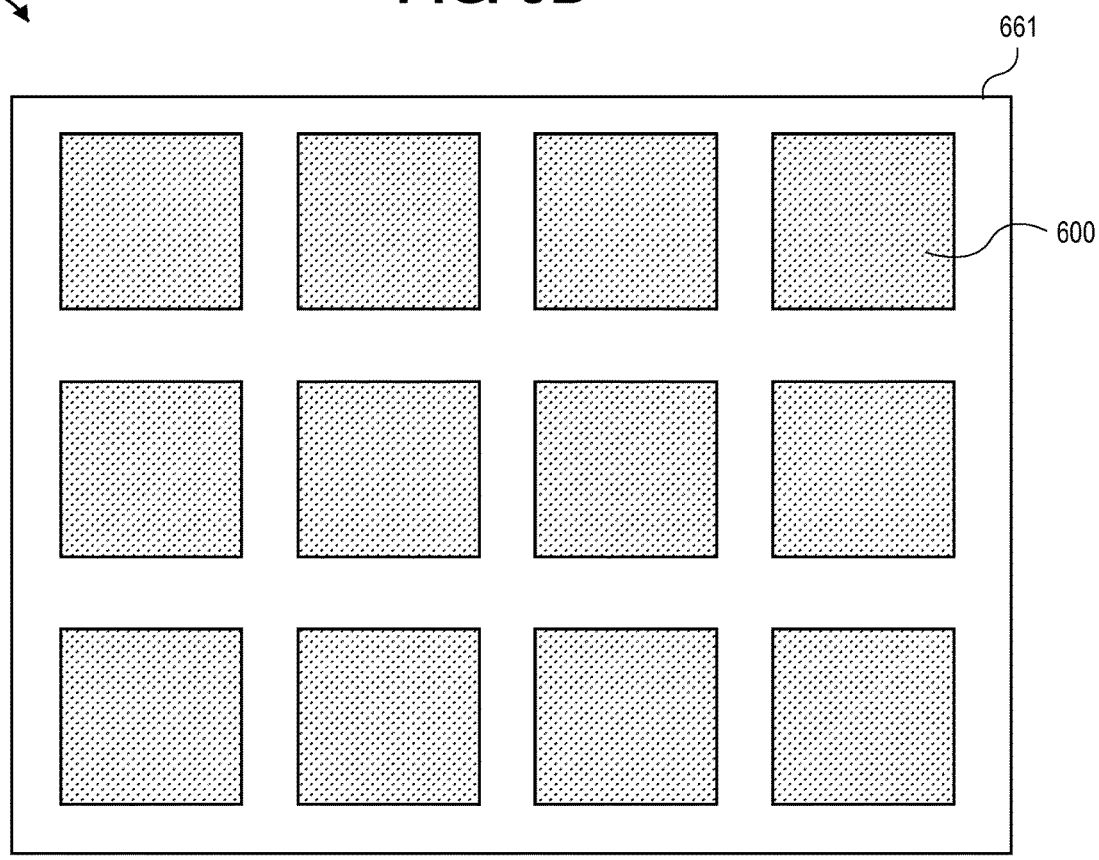
FIG. 6 is a plan view illustration of a system with a plurality of photodiodes with a CIGS film, in accordance with an embodiment.

Referring now to FIG. 6, a plan view illustration of a system 660 that comprises a plurality of photodiodes 600 is shown, in accordance with an embodiment. In an embodiment, the system 660 may comprise a substrate 661. In an embodiment, the substrate 661 may comprise a glass substrate, a silicon substrate, or any other suitable substrate. An array of photodiodes 600 may be arranged over the substrate 661. The photodiodes 600 may be substantially similar to the photodiodes described above. For example, each of the photodiodes 600 may comprise a CIGS absorber layer, a $Ga_2O_3$:Sn semiconductor layer, and a $Ga_2O_3$ hole blocker layer with excess oxygen. In an embodiment, the system 660 may be used for any application that utilizes photodiodes, such as imaging, sensing, solar cells, or the like.

Figure 7:
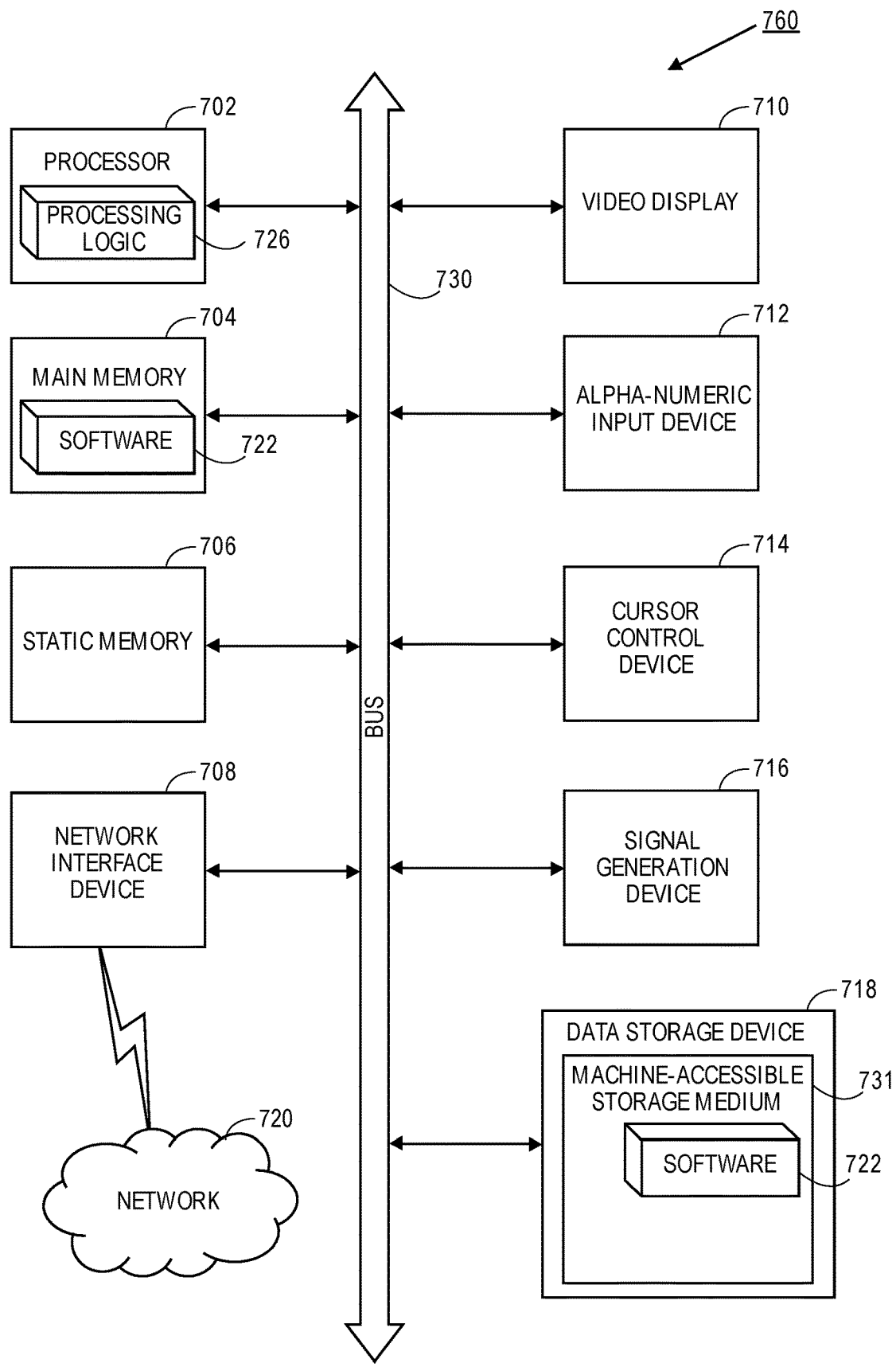
FIG. 7 illustrates a block diagram of an exemplary computer system that may be used in conjunction with processes for forming an optimized photodiode with a CIGS film, in accordance with an embodiment.

Referring now to FIG. 7, a block diagram of an exemplary computer system 760 of a processing tool is illustrated in accordance with an embodiment. In an embodiment, computer system 760 is coupled to and controls processing in the processing tool. Computer system 760 may be connected (e.g., networked) to other machines in a Local Area Network (LAN), an intranet, an extranet, or the Internet. Computer system 760 may operate in the capacity of a server or a client machine in a client-server network environment, or as a peer machine in a peer-to-peer (or distributed) network environment. Computer system 760 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 760, the term "machine" shall also be taken to include any collection of machines (e.g., computers) that individually or jointly execute a set (or multiple sets) of instructions to perform any one or more of the methodologies described herein.

Computer system 760 may include a computer program product, or software 722, having a non-transitory machine-readable medium having stored thereon instructions, which may be used to program computer system 760 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 760 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 760 may further include a system network interface device 708 for communicating with other devices or machines. The computer system 760 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 731 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 760, the main memory 704 and the system processor 702 also constituting machine-readable storage media. The software 722 may further be transmitted or received over a network 720 via the system network interface device 708. In an embodiment, the network interface device 708 may operate using RF coupling, optical coupling, acoustic coupling, or inductive coupling.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method of creating a photodiode, comprising:
    disposing an absorber layer over a first contact, wherein the absorber layer comprises a first conductivity type;
    disposing a semiconductor layer over the absorber, wherein the semiconductor layer has a second conductivity type that is opposite from the first conductivity type;
    disposing a hole blocking layer over the semiconductor layer, wherein the hole blocking layer is formed with a reactive sputtering process with a processing gas that comprises oxygen, and wherein the hole blocking layer comprises an excess concentration of oxygen; and
    disposing a second contact over the hole blocking layer.

2. The method of claim 1, wherein the absorber layer comprises a $CuIn_{1-x}Ga_xSe_2$ (CIGS) film.

3. The method of claim 1, wherein the semiconductor layer and the hole blocking layer both comprise $Ga_2O_3$.

4. The method of claim 3, wherein the semiconductor layer is doped with Sn.

5. The method of claim 3, wherein the semiconductor layer is disposed with a reactive sputtering process.

6. The method of claim 5, wherein the reactive sputtering process comprises a processing gas that comprises oxygen.

7. The method of claim 4, wherein the Sn concentration is between approximately 5 atomic percent and approximately 10 atomic percent.

8. The method of claim 3, wherein an oxygen concentration of the hole blocking layer has up to an additional 5 atomic percent of oxygen beyond the oxygen concentration of $Ga_2O_3$.

9. The method of claim 1, wherein the first conductivity type is P-type and the second conductivity type is N-type.

10. A photodiode, comprising:
    an absorber layer, wherein the absorber layer has a first conductivity type;
    a semiconductor layer over the absorber layer, wherein the semiconductor layer has a second conductivity type; and
    a hole blocking layer over the semiconductor layer, wherein the hole blocking layer comprises an excess concentration of oxygen.

11. The photodiode of claim 10, wherein the absorber layer comprises a $CuIn_{1-x}Ga_xSe_2$ (CIGS) film.

12. The photodiode of claim 10, wherein the semiconductor layer comprises $Ga_2O_3$ and Sn.

13. The photodiode of claim 12, wherein an atomic percentage of Sn in the semiconductor layer is between approximately 5% and 10%.

14. The photodiode of claim 10, wherein the hole blocking layer comprises $Ga_2O_3$.

15. The photodiode of claim 14, wherein an atomic percentage of oxygen in the hole blocking layer is increased by approximately 1% to 5% compared to the atomic percentage of oxygen in $Ga_2O_3$.

16. The photodiode of claim 10, wherein the first conductivity type is P-type and the second conductivity type is N-type.

17. The photodiode of claim 10, further comprising:
a first contact below the absorber; and
a second contact above the hole blocker.

18. A photodiode, comprising:
a first contact;
a P-type absorber over the first contact, wherein the absorber comprises a $CuIn_{1-x}Ga_xSe_2$ (CIGS) film;
an N-type semiconductor layer over the absorber, wherein the semiconductor layer comprises $Ga_2O_3$ and Sn;
a hole blocker over the semiconductor layer, wherein the hole blocker comprises $Ga_2O_3$ with an excess atomic percentage of oxygen; and
a second contact over the hole blocker.

19. The photodiode of claim 18, wherein the excess atomic percentage of oxygen is up to approximately 5% higher than exists in $Ga_2O_3$.

20. The photodiode of claim 18, wherein an atomic percentage of Sn in the N-type semiconductor layer is between approximately 5% and approximately 10%.

* * * * *